(12) United States Patent
Chen et al.

(10) Patent No.: US 7,662,712 B2
(45) Date of Patent: Feb. 16, 2010

(54) UV BLOCKING AND CRACK PROTECTING PASSIVATION LAYER FABRICATING METHOD

(75) Inventors: Lee Jen Chen, Taipei (TW); Shing Ann Luo, Toufen (TW); Chin Ta Su, Erlun Shiang (TW)

(73) Assignee: Macronix International Co., Ltd., Hsinchu (TW)

(*) Notice: Subject to any disclaimer, the term of this patent is extended or adjusted under 35 U.S.C. 154(b) by 136 days.

(21) Appl. No.: 11/352,425

(22) Filed: Feb. 10, 2006

(65) Prior Publication Data

US 2007/0190806 A1 Aug. 16, 2007

(51) Int. Cl.
*H01L 21/4763* (2006.01)

(52) U.S. Cl. .............. 438/624; 438/788; 257/E21.576; 257/E21.276

(58) Field of Classification Search ............... 257/646, 257/760, 368, 632, E21.029, E21.279; 438/628, 438/624, 636, 257, 744, 757, 791, 724, 769, 438/778, 627

See application file for complete search history.

(56) References Cited

U.S. PATENT DOCUMENTS

| | | | | |
|---|---|---|---|---|
| 4,988,423 A | * | 1/1991 | Yamamoto et al. | 204/192.17 |
| 5,057,897 A | * | 10/1991 | Nariani et al. | 257/637 |
| 5,679,606 A | * | 10/1997 | Wang et al. | 438/763 |
| 5,795,821 A | * | 8/1998 | Bacchetta et al. | 438/624 |
| 5,858,870 A | | 1/1999 | Zheng et al. | |
| 5,869,394 A | | 2/1999 | Chen et al. | |
| 5,872,064 A | * | 2/1999 | Huff et al. | 438/778 |
| 6,017,780 A | | 1/2000 | Roy | |
| 6,087,278 A | | 7/2000 | Kim et al. | |
| 6,274,514 B1 | | 8/2001 | Jang et al. | |
| 6,365,959 B2 | * | 4/2002 | Yuasa et al. | 257/646 |
| 6,376,359 B1 | * | 4/2002 | Lin et al. | 438/622 |
| 6,451,687 B1 | * | 9/2002 | Liu et al. | 438/624 |
| 6,458,722 B1 | | 10/2002 | Kapoor et al. | |
| 6,465,265 B2 | | 10/2002 | Opsal et al. | |
| 6,475,895 B1 | | 11/2002 | Mei et al. | |
| 6,521,922 B1 | | 2/2003 | Huang et al. | |
| 6,727,588 B1 | * | 4/2004 | Abdelgadir et al. | 257/751 |
| 6,790,772 B2 | | 9/2004 | Chung et al. | |
| 6,828,255 B2 | * | 12/2004 | Lai et al. | 438/761 |
| 6,828,625 B2 | | 12/2004 | Bloom et al. | |

(Continued)

OTHER PUBLICATIONS

Yoshida, Improvement of Endurance to Hot Carrier Degradation by Hydrogen blocking P-SiO, Hitachi VLSI Engineering, IEEE 1988, pp. 22-25 (IEDM 88).*

(Continued)

*Primary Examiner*—W. David Coleman
*Assistant Examiner*—Latanya Crawford
(74) *Attorney, Agent, or Firm*—James F. Hann; Haynes Beffel & Wolfeld LLP

(57) ABSTRACT

A method for fabricating a semiconductor device includes providing a semiconductor substrate comprising a patterned metal conductor layer. To provide UV blocking, an overlying separation layer is formed over the substrate, and a UV blocking layer of silicon enriched oxide is formed over the separation layer. The UV blocking layer has a silicon atomic concentration sufficient for ultraviolet blocking. A gap-filling, hydrogen-blocking layer may be formed over the semiconductor substrate, and any the UV blocking layer, to prevent hydrogen from passing therethrough.

12 Claims, 1 Drawing Sheet

U.S. PATENT DOCUMENTS

| | | |
|---|---|---|
| 6,890,865 B2 | 5/2005 | Yin et al. |
| 6,969,654 B1 * | 11/2005 | Pham et al. ................ 438/261 |
| 6,984,857 B2 * | 1/2006 | Udayakumar et al. ....... 257/295 |
| 7,052,988 B1 * | 5/2006 | van Schravendijk et al. 438/636 |
| 7,060,554 B2 | 6/2006 | Ngo et al. |
| 7,060,580 B2 | 6/2006 | Cho et al. |
| 7,087,482 B2 | 8/2006 | Yeo et al. |
| 7,157,331 B2 | 1/2007 | Lu et al. |
| 7,169,696 B2 | 1/2007 | Heath et al. |
| 7,208,426 B2 * | 4/2007 | Huang et al. ................ 438/788 |
| 2001/0005037 A1 * | 6/2001 | Kakamu ..................... 257/632 |
| 2003/0092284 A1 | 5/2003 | Huang et al. |
| 2003/0162384 A1 * | 8/2003 | Smith et al. ................ 438/628 |
| 2003/0168001 A1 | 9/2003 | Sneh |
| 2003/0181030 A1 * | 9/2003 | Hsu et al. ................... 438/624 |
| 2003/0211725 A1 | 11/2003 | Chung et al. |
| 2004/0005781 A1 | 1/2004 | Huang et al. |
| 2004/0061179 A1 * | 4/2004 | Carroll et al. ............... 257/368 |
| 2004/0151025 A1 | 8/2004 | Ngo et al. |
| 2004/0191989 A1 * | 9/2004 | Ngo et al. ................... 438/257 |
| 2004/0240375 A1 | 12/2004 | Shinoda |
| 2005/0006712 A1 * | 1/2005 | Ngo et al. ................... 257/410 |
| 2005/0179116 A1 * | 8/2005 | Rossi et al. ................. 257/649 |
| 2005/0275105 A1 * | 12/2005 | Lu et al. ..................... 257/758 |
| 2006/0019500 A1 | 1/2006 | Luoh et al. |
| 2006/0138666 A1 * | 6/2006 | Kim ........................... 257/760 |
| 2006/0145303 A1 * | 7/2006 | Wu et al. .................... 257/632 |
| 2007/0001160 A1 | 1/2007 | Cheong et al. |
| 2007/0080378 A1 | 4/2007 | Lu et al. |
| 2007/0187813 A1 | 8/2007 | Chen et al. |

OTHER PUBLICATIONS

Ashburn, S. P. et al., Degradation of Deep Sub-micron Isolation by Vacuum Ultraviolet Radiation from Low Temperature Back End Plasma-Assisted Processes, IEEE, IEDM, 1997, pp. 449-452.

Dori, Leonello, et al., "Optimized Silicon-Rich Oxide (SRO) Deposition Process for 5-V-Only Flash EEPROM Applications," IEEE Electron Device Letters 14(6) (Jun. 1993) pp. 283-285.

Shuto, Susumu, et al., "UV-blocking technology to reduce plasma-induced transistor damage in ferroelectric devices with low hydrogen resistance," IEEE, 37th Annual International Reliability Physics Symp, 1999, 356-361.

Singer, Peter, ed. "Anti-Reflective Coatings: A Story of Interfaces," Semiconductor International, Mar. 1, 1999, 5 pp.

Song, Seung-Chul et al., Avoiding Plasma Induced Damage to Gate Oxide with Conductive Top Film (CTF) on PECVD Contact Etch Stop Layer, 2002 Symposium on VLSI Technology Digest of Technical Papers, pp. 72-73.

Thomas, N. et al., UV-Shifted Durable Silver Coating for Astronomical Mirrors, Submitted to Astronomical Telescopes and Instrumentation, Munich, Germany, Mar. 27-31, 2000, 14 pp.

* cited by examiner

UV BLOCKING AND CRACK PROTECTING PASSIVATION LAYER FABRICATING METHOD

CROSS-REFERENCE TO OTHER APPLICATIONS

This application relates to the following U.S. patent applications, each of which is assigned to the assignee of the present application: application Ser. No. 10/858,352, entitled Ultraviolet Blocking Layer, of inventors Chien Hung Lu and Chin Ta Su, filed on 1 Jun. 2004, issued on 2 Jan. 2007 as U.S. Pat. No. 7,157,331; application Ser. No. 11/116,719, entitled Ultraviolet Blocking Layer, of inventors Tuung Luoh, Ling-Wuu Yang, and Kuang-Chao Chen, filed on 28 Apr. 2005, published on 26 Jan. 2006 as U.S. 2006-0019500-A1; and application Ser. No. 11/352,169, entitled UV Blocking and Crack Protecting Passivation Layer, of inventors Chien Hung Lu and Chin Ta Su, filed on the same day as this application.

BACKGROUND OF THE INVENTION

1. Field of the Invention

Various embodiments relate in general to semiconductor devices and to processes for fabricating semiconductor devices. More particularly, various embodiments relate to semiconductors having a passivation layer including one or both of an ultraviolet radiation (UV) blocking layer and a compressively stressed, crack-preventing layer and also to processes for fabricating such semiconductor devices.

2. Description of Related Art

As device geometry has continued to shrink, dimensional requirements of devices become more exacting while the aspect ratios of etching or gap filling rise. Plasma process technology is indispensable for ULSI fabrication that meets these demands. Examples of plasma process applications include plasma implantation, plasma sputtering, physical vapor deposition (PVD), dry etching, and chemical vapor deposition (CVD), for example, plasma assisted CVD, plasma-enhancement CVD, and high-density plasma CVD. During plasma processing, photons are generated with wavelengths in and above the UV spectrum.

Passivation layers are typically deposited, using plasma processes, over the top of the wafer after the final patterned conductor layer has been made. The passivation layer is used to protect the device structures from mechanical damage, such as scratching, as well as chemical damage, such as from moisture and other contaminants. With some types of devices it is important that the passivation layer permit the passage of UV to the device; for example, some flash memory devices need a UV-erase process to erase the initial charge within the floating gate. However, with many other devices and structures it is necessary to prevent the passage of UV to the devices or structures, such as through the passivation layer. U.S. patent application Ser. No. 10/858,352 entitled Ultraviolet Blocking Layer discloses the use of a super silicon rich oxide layer as a UV blocking layer. The disclosure of this application as it relates to the theory, composition and process steps involved in the deposition of a UV blocking layer is incorporated by reference.

BRIEF SUMMARY OF THE INVENTION

A first aspect of the invention is directed to a method for fabricating a semiconductor device having an ultraviolet (UV) blocking layer. A semiconductor substrate, comprising a patterned metal conductor layer, is provided. A separation layer is formed to overlie the semiconductor substrate and patterned metal conductor layer. A UV blocking layer of silicon enriched oxide is formed to overlying said separation layer. The UV blocking layer forming step is carried out so that the UV blocking layer has a silicon atomic concentration sufficient for ultraviolet blocking. According to some methods of the invention, the UV blocking layer forming step may be carried out so that the silicon atomic concentration is at least about 70% and preferably is at least about 85%. The UV blocking layer forming step may be carried out so that the UV blocking layer has an extinction coefficient of at least 1.3 for a range of wavelengths less than 400 nanometers. The UV blocking layer forming step may be carried out so that the UV blocking layer has a ratio of silicon concentration to oxygen concentration of at least about 10. The UV blocking layer forming step may be carried out so that the UV blocking layer blocks at least 70%, and preferably 90%, of radiation having a wavelength of 400 nm or less. A gap-filling, hydrogen-blocking layer may be formed over the UV blocking layer to prevent hydrogen from passing therethrough. A compressively stressed layer may be formed over the gap-filling, hydrogen-blocking layer to help prevent cracks therein.

A second aspect of the invention is directed to a method for fabricating a semiconductor device having a crack protecting, hydrogen-blocking passivation layer. A semiconductor substrate, comprising a patterned conductor layer, is provided. A passivation layer is formed overlying the semiconductor substrate and the patterned conductor layer. The passivation layer forming step comprises forming a gap-filling, hydrogen-blocking layer over the semiconductor substrate and patterned conductor layer, the gap-filling, hydrogen-blocking layer forming step being carried out so that the gap-filling, hydrogen-blocking layer is constructed to prevent hydrogen from passing therethrough. The passivation layer forming step also comprises forming a compressively stressed layer overlying the gap-filling, hydrogen-blocking layer to help prevent cracks in the passivation layer. According to some methods on the invention, the hydrogen-blocking layer forming step is carried out so that the gap-filling, hydrogen-blocking layer has a silicon atomic concentration of 40%-60%. The hydrogen-blocking layer forming step may be carried out so that the gap-filling, hydrogen-blocking layer has a refraction index (RI) of at least about 1.5 at a wavelength of 248 nm.

Various features and advantages of the invention will appear from the following description in which the preferred embodiments have been set forth in detail in conjunction with the accompanying drawings.

BRIEF DESCRIPTION OF THE DRAWINGS

The drawing FIGURE is a simplified cross-sectional view of a portion of a semiconductor device made according to the invention.

DETAILED DESCRIPTION OF THE INVENTION

Figure 1:
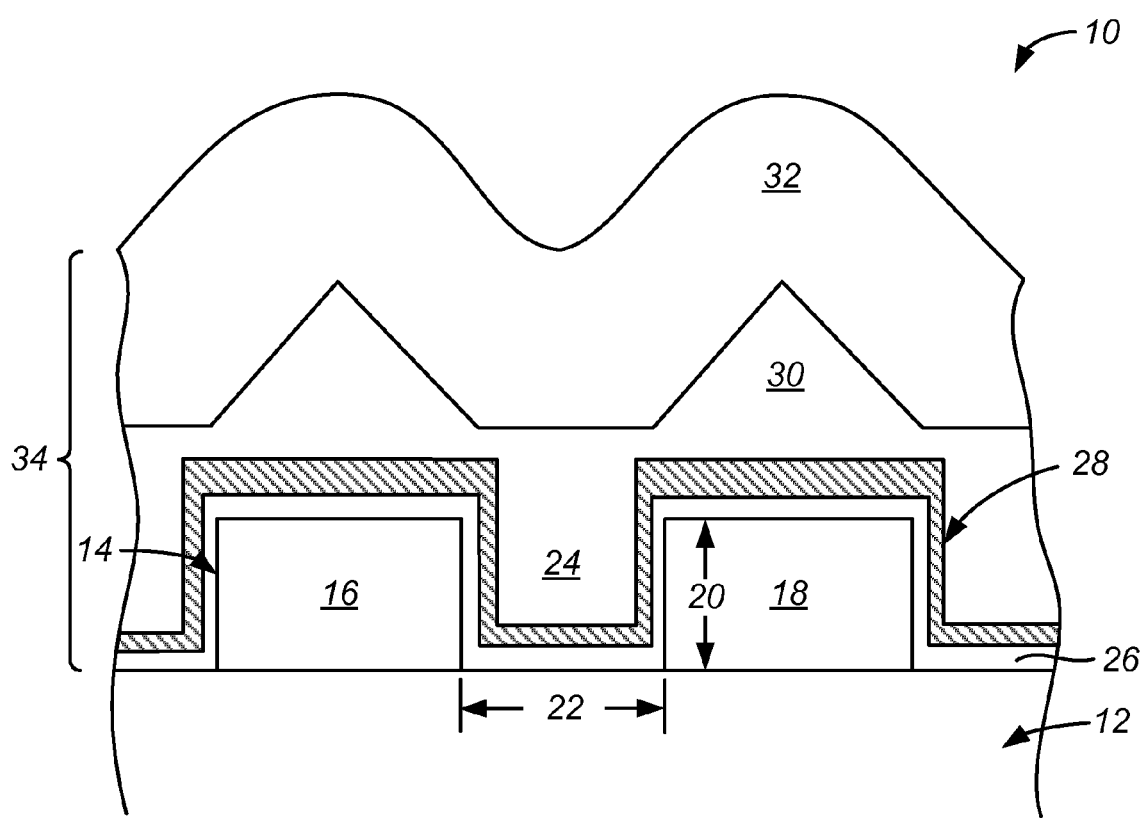

The following description of the invention will typically be with reference to specific structural embodiments and methods. It is to be understood that there is no intention to limit the invention to the specifically disclosed embodiments but that the invention may be practiced using other features, elements, methods and embodiments.

The use of a super silicon rich oxide layer as a UV protection layer to block UV may create a bridge issue when used with a patterned metal conductor layer. The high concentration of silicon in the UV protection layer can result in metal atoms, such as aluminum, diffusing from the metal conductor layer into the silicon rich UV protection layer creating a metal bridge defect. The present invention addresses this issue. Another issue with regard to passivation layers relates to cracking of the passivation layer. The present invention also addresses this passivation layer cracking issue.

Ultraviolet radiation includes electromagnetic radiation at wavelengths no longer than 400 nm. A subset of one or more wavelengths no longer than 400 nm is a range of wavelengths less than 400 nm.

The Beer-Lambert Law describes the absorption of electromagnetic radiation by a layer as follows:

$$I=I0*e-\alpha d$$

where: I0 represents the initial intensity of the electromagnetic radiation prior to transiting the layer; I represents the intensity of the electromagnetic radiation once having transited the layer, d represents the layer thickness; and α represents the absorption coefficient.

The ratio (I/I0) indicates the percentage of electromagnetic radiation that successfully transits the layer.

The absorption coefficient can also be expressed as follows:

$$\alpha=(4\pi K)/\lambda$$

where K represents the extinction coefficient and λ represents the wavelength. The extinction coefficient K is a dimensionless quantity.

FIG. 1 is a simplified cross-sectional view of a portion of a semiconductor device 10 made according to the invention. Device 10 includes a substrate 12 upon which a patterned metal conductor layer 14 has been deposited. Layer 14 includes conductors 16, 18 having a height 20 separated by spacing 22 to create a gap 24 between conductors 16, 18.

The passivation layer for device 10 begins with a separation layer 26 deposited on substrate 12 and layer 14. Separation layer 26 is preferably made of SiON. Next, a UV protection layer 28 is deposited on separation layer 26. Layer 28 is a high Si content oxide layer, sometimes called silicon rich oxide or Super Si Rich Oxide (SSRO). Its silicon atomic concentration is at least 70% and preferably more than 85%. Layer 28 has an extinction coefficient (K) of at least about 1.3 for a range of wavelengths less than 400 nm; in one preferred embodiment layer 28 has an extinction coefficient (K) of approximately 1.7 at a wavelength of 248 nm. UV protection layer 28 has a ratio of silicon concentration to oxygen concentration sufficient for ultraviolet blocking; this ratio is preferably at least about 10. This Si-rich oxide layer 28 is used to prevent UV light damage to the semiconductor components of device 10 by virtue of its high extinction coefficient property. Therefore, the effectiveness of the SSRO liner (layer 28) to block UV can be defined by one or more of the following: (1) an Si atomic concentration of greater than 70% and preferably greater than 85%, (2) an extinction coefficient (K) of at least about 1.3 for a range of wavelengths less than 400 nm, and preferably at least 1.7 at 248 nm, and (3) a ratio of silicon concentration to oxygen concentration of at least about 10. The extinction coefficient technique is typically preferred to monitor the process. However, Si atomic concentration technique or the silicon to oxygen concentration ratio technique may be preferred to check product samples.

It has been found that because of the high concentration of Si in UV protection layer 28, without the use of separation layer 26 metal atoms from patterned metal conductor layer 14, such as Al atoms, will tend to diffuse into layer 28 creating a bridge defect. Separation layer 26 is therefore used to separate the SSRO layer 28 from patterned metal conductor layer 14. Doing so helps to prevent diffusion of the metal atoms from patterned metal conductor layer 14 into UV protection layer 28 thus helping to eliminate the metal bridge issue.

Next, a gap-filling, hydrogen-blocking layer 30 is deposited on layer 28. Layer 30 is a silicon rich oxide layer (sometimes called Si Rich Oxide or SRO). The Si atomic concentration of SRO layer 30 is typically much lower, such as about 30-50% lower, than the Si atomic concentration of SSRO layer 28. In some embodiments the silicon atomic concentration of SRO layer 30 may be 40% to 60%. Because of its higher Si concentration, layer 30 blocks hydrogen better than general SiO2, general SiO2 typically having a silicon atomic concentration of about 35%. It is preferred that the aspect ratio, that is height 20 to spacing 22 of conductors 16, 18 be less than 3 to help ensure that layer 30 fills in gap 24.

The refractive index RI ($n=C_0/C$, where $C_0$ is the speed of light in free space, C is the speed of light in the medium) is often used to monitor oxide film for its ability to block hydrogen. The Si dangling bonds in Si-rich oxide films are what block hydrogen. The greater the amount of silicon in the oxide film, the higher the n-value (refractive index). Therefore, a higher n-value implies an oxide film with a higher silicon concentration, more Si dangling bonds and thus a greater ability to block hydrogen. SRO layer 30 may have a refraction index (RI) of at least about 1.5, and preferably at least about 1.6, when the wavelength is 248 nm.

Finally, a compressively stressed layer 32, typically made of SiON, is deposited on layer 30. The combination of layers 26, 28, 30 and 32 constitute, in this embodiment, a passivation layer 34. The amount of the compressive stress within layer 32 can be adjusted in conventional manners by changing process conditions. The provision of appropriate compressive stresses in layer 32 helps to prevent cracking in passivation layer 34. Further processing steps can be accomplished after deposition of layer 32. For example, a photoresist may be deposited on layer 32 and then etched to expose, for example, wire bond pads.

SSRO layer 28 need not completely block all UV to successfully serve as a UV blocking layer. SSRO layer 28 needs to provide sufficient UV blocking to protect underlying features from UV damage in the particular manufacturing flow. However, it is expected that SSRO layer 28 should block at least about 70%, and preferably at least about 90%, of W.

Increases in the thickness of SSRO UV blocking layer 28 leads to greater UV blocking capability of layer 28. While it may be theoretically possible to make UV blocking layer 28 with a silicon atomic concentration substantially less than 70%, such as 60%, such a blocking layer would need to be excessively thick, and thus prone to have poor gap-fill performance.

The following are exemplary process parameters for each of the layers.

Separation layer 26 (SiON): Plasma-enhancement chemical vapor deposition (PECVD) using (N2O, SiH4) at the following flow rates: N2:5000~10000 sccm/SiH4: 100~300 sccm/N2O:150~500 scm, at the following RF power levels: 200~500 W, in the following pressure range: 2~5 torr, at the following temperature: <400C, and for the following deposition time: <5 s. Separation layer 26 has a thickness of 50 to 500 Å, with a preferred thickness of about 100 Å.

UV protection layer 28 (SSRO): High-density plasma chemical vapor deposition (HDP CVD) using (SiH4, O2) at the following flow rates: SiH4:50~200 sccm/O2:20~100 sccm, at the following temperature: <400C. UV protection layer 28 has a thickness of 200 Å to 1000 Å with a preferred thickness of about 500 Å. PECVD using (SiH4, N2O) may be used instead of HDP CVD using (SiH4, O2). At least one of the following reactants: TEOS/O2, and TEOS/O3 may also be used for SSRO layer 28. Other deposition techniques, such as semi-atmosphere chemical vapor deposition (SACVD), may be used.

Gap-filling, hydrogen-blocking layer 30 (SRO): HDP CVD using (SiH4,O2) at the following flow rates: SiH4: 50~200 sccm/O2:50~200 sccm, at the following power levels LF: 1000~3000 W/HF: 1000~3000 W, at the following temperature: <400C. Gap-filling, hydrogen-blocking layer 30 has a thickness of about 4000 Å to 8000 Å; this thickness depends in large part upon height 20 of metal conductors 16, 18.

Compressively stressed layer 32 (SiON): PECVD using (SiH4,N2, N2O or NH3) at the following flow rates: N2: 5000~10000 sccm/SiH4: 100~300 sccm/N2O: 150~500 scm, at the following RF power levels: 200~500 W, in the following pressure range: 2~5 torr, at the following temperature: <400C, and with the deposition time depending upon thickness. Compressively stressed layer 32 has a thickness of 4000 Å to 10000 Å, with a preferred thickness of about 7000 Å.

For UV protection layer 28 (SSRO), by tuning process parameters such as the ratio of the flow rates of the sources, other embodiments can be made which have a refractive index greater than about 1.5, and preferably greater than about 1.6, for a range of wavelengths less than 400 nanometers, an extinction coefficient at least about 1.3 for a range of wavelengths less than 400 nanometers, and preferably at least 1.7 at 248 nanometers.

Other modification and variation can be made to the disclosed embodiments without departing from the subject of the invention as defined in following claims.

Any and all patents, patent applications and printed publications referred to above are incorporated by reference.

What is claimed is:

1. A method for fabricating a semiconductor device having an ultraviolet (UV) blocking layer comprising the steps of:
   providing a semiconductor substrate comprising a patterned metal conductor layer, the patterned metal conductor layer comprising metal conductors separated by gaps to create a first surface contour with first raised portions defining first gaps therebetween;
   forming a dielectric separation layer overlying the semiconductor substrate and patterned metal conductor layer;
   the dielectric separation layer forming step carried out so that the dielectric separation layer follows the first surface contour to create a second surface contour with second raised portions defining second gaps therebetween;
   forming a UV blocking layer of super silicon enriched oxide, having a silicon atomic concentration is at least about 70%, overlying and directly contacting said separation layer;
   the UV blocking layer forming step carried out so that the UV blocking layer follows the second surface contour to create a third surface contour with second raised portions defining third gaps therebetween; and
   the UV blocking layer forming step being carried out with the UV blocking layer having an extinction coefficient of at least about 1.7 at a wavelength of 248 nm for ultraviolet blocking.

2. The method according to claim 1, wherein the UV blocking layer forming step is carried out so that the silicon atomic concentration is at least about 85%.

3. The method according to claim 1, wherein the UV blocking layer forming step is carried out so that the UV blocking layer has a ratio of silicon concentration to oxygen concentration of at least about 10.

4. The method according to claim 1, wherein the UV blocking layer forming step is carried out so that the UV blocking layer blocks at least 70% of radiation having a wavelength of 400 nm or less.

5. The method according to claim 1, wherein the UV blocking layer forming step is carried out so that the UV blocking layer blocks at least 90% of radiation having a wavelength of 400 nm or less.

6. The method according to claim 1, further comprising forming a gap-filling, hydrogen-blocking layer over the UV blocking layer, the gap-filling, hydrogen-blocking layer forming step carried out so that the gap-filling, hydrogen-blocking layer is constructed to prevent hydrogen from passing therethrough.

7. The method according to claim 6, further comprising forming a compressively stressed layer overlying the gap-filling, hydrogen-blocking layer to help prevent cracks therein.

8. The method according to claim 6, wherein the hydrogen-blocking layer forming step is carried out so that the hydrogen-blocking layer has a refraction index of at least about 1.5 at a wavelength of 248 nm.

9. The method according to claim 6, wherein the hydrogen-blocking layer forming step is carried out so that the hydrogen-blocking layer has a refraction index of at least about 1.6 at a wavelength of 248 nm.

10. A method for fabricating a semiconductor device having an ultraviolet (UV) blocking layer and a crack protecting, hydrogen-blocking passivation layer, comprising the steps of:
    providing a semiconductor substrate comprising a patterned metal conductor layer, the patterned metal conductor layer comprising metal conductors separated by gaps to create a first surface contour with first raised portions defining first gaps therebetween;
    forming a dielectric separation layer overlying the semiconductor substrate and patterned metal conductor layer;
    the dielectric separation layer forming step carried out so that the dielectric separation layer follows the first surface contour to create a second surface contour with second raised portions defining second gaps therebetween;
    forming a UV blocking layer of super silicon enriched oxide, having a silicon atomic concentration is at least about 70%, overlying and directly contacting said separation layer;
    the UV blocking layer forming step carried out so that the UV blocking layer follows the second surface contour to create a third surface contour with second raised portions defining third gaps therebetween;
    the UV blocking layer forming step being carried out with the super silicon enriched oxide UV blocking layer having an extinction coefficient of at least about 1.7 at a wavelength of 248 nm for ultraviolet blocking;

forming a gap-filling, hydrogen-blocking, silicon oxide layer over the UV blocking layer, the gap-filling, hydrogen-blocking layer forming step carried out so that the gap-filling, hydrogen-blocking layer comprises a silicon rich oxide layer having a refraction index of at least 1.5 at a wavelength of 248 nm to prevent hydrogen from passing therethrough; and forming a compressively stressed layer overlying the gap-filling, hydrogen-blocking layer to help prevent cracks in an underlying layer.

11. The method according to claim 10, wherein the UV blocking layer forming step is carried out so that the UV blocking layer has a ratio of silicon concentration to oxygen concentration of at least about 10.

12. The method according to claim 10, wherein the hydrogen-blocking layer forming step is carried out so that the gap-filling, hydrogen-blocking layer has a silicon atomic concentration of 40%-60%.

* * * * *